United States Patent
Chen et al.

(10) Patent No.: US 11,121,254 B2
(45) Date of Patent: Sep. 14, 2021

(54) TRANSISTOR WITH STRAINED SUPERLATTICE AS SOURCE/DRAIN REGION

(71) Applicant: UNITED MICROELECTRONICS CORP., Hsin-Chu (TW)

(72) Inventors: Bo-Shiun Chen, Taichung (TW); Chun-Jen Chen, Tainan (TW); Chung-Ting Huang, Kaohsiung (TW); Chi-Hsuan Tang, Kaohsiung (TW); Jhong-Yi Huang, Nantou County (TW); Guan-Ying Wu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/572,568

(22) Filed: Sep. 16, 2019

(65) Prior Publication Data
US 2021/0057579 A1 Feb. 25, 2021

(30) Foreign Application Priority Data
Aug. 19, 2019 (TW) ................. 108129423

(51) Int. Cl.
| H01L 29/78 | (2006.01) |
| H01L 21/02 | (2006.01) |
| H01L 29/08 | (2006.01) |
| H01L 29/15 | (2006.01) |
| H01L 29/66 | (2006.01) |

(52) U.S. Cl.
CPC .... *H01L 29/7848* (2013.01); *H01L 21/02532* (2013.01); *H01L 21/02587* (2013.01); *H01L 29/0847* (2013.01); *H01L 29/157* (2013.01); *H01L 29/66522* (2013.01)

(58) Field of Classification Search
CPC ....................................... H01L 29/0843–0891
See application file for complete search history.

(56) References Cited

U.S. PATENT DOCUMENTS

| 5,323,020 A | * | 6/1994 | Mohammad | ........ H01L 29/1029 257/19 |
| 5,783,839 A | * | 7/1998 | Morikawa | ....... H01L 31/035254 257/21 |
| 6,593,625 B2 | | 7/2003 | Christiansen | |
| 7,544,997 B2 | | 6/2009 | Zhang | |
| 2015/0108430 A1 | * | 4/2015 | Cheng | ............ H01L 21/823821 257/20 |
| 2016/0163860 A1 | | 6/2016 | Lee | |

FOREIGN PATENT DOCUMENTS

WO        98/42033        9/1998

* cited by examiner

*Primary Examiner* — Suberr L Chi
(74) *Attorney, Agent, or Firm* — Winston Hsu

(57) ABSTRACT

A transistor with strained superlattices as source/drain regions includes a substrate. A gate structure is disposed on the substrate. Two superlattices are respectively disposed at two sides of the gate structure and embedded in the substrate. The superlattices are strained. Each of the superlattices is formed by a repeated alternating stacked structure including a first epitaxial silicon germanium and a second epitaxial silicon germanium. The superlattices serve as source/drain regions of the transistor.

13 Claims, 5 Drawing Sheets

TRANSISTOR WITH STRAINED SUPERLATTICE AS SOURCE/DRAIN REGION

BACKGROUND OF THE INVENTION

1. Field of the Invention

The present invention relates to a transistor with strained superlattices as source/drain regions, and a fabricating method of the same.

2. Description of the Prior Art

The speed of a Metal Oxide Semiconductor Field Effect Transistor (MOSFET) depends primarily on electron mobility in the channel region between the source and the drain. In general, mobility is a measure of hole or electron scattering in a semiconductor. Increasing mobility can have a profound benefit for digital electronic devices allowing faster switching and lower power consumption. Therefore, methods of increasing electron and hole mobility in transistors have been a major focus.

One way to improve transistor performance is through selective application of stress to the transistor channel region. Stress distorts (i.e., strains) the semiconductor crystal lattice, and the distortion, in turn, affects the band alignment and charge transport properties of the semiconductor. By controlling the magnitude and distribution of stress in a finished device, manufacturers can increase carrier mobility and improve device performance.

One solution to increase transistor speed is to strain the silicon in the channel. Compressing the channel region in PMOS transistors is particularly important because hole mobility in PMOS transistors is much less than electron mobility in NMOS transistors due to the higher effective mass of holes.

There are several existing approaches of introducing stress in the transistor channel region. However, the conventional method still has its limitation of providing higher stress to the channel region.

SUMMARY OF THE INVENTION

In light of the above, the present invention provides a transistor with superlattices serve as source/drain regions to provide high stress.

According to a preferred embodiment of the present invention, a transistor with strained superlattices as source/drain regions includes a substrate. A gate structure is disposed on the substrate. Two superlattices are respectively disposed at two sides of the gate structure and embedded in the substrate, wherein the two superlattices are strained, the each of the two superlattices is formed by a repeated alternating stacked structure including a first epitaxial silicon germanium and a second epitaxial silicon germanium, and the two superlattices serve as source/drain regions of the transistor.

According to another preferred embodiment of the present invention, a fabricating method of a transistor with strained superlattices as source/drain regions includes providing a substrate, wherein a gate structure is disposed on the substrate. Then, two recesses are formed in the substrate at two sides of the gate structure. Finally, two superlattices are respectively formed in each of the two recesses, wherein the steps of forming the two superlattices comprises forming an epitaxial silicon and an epitaxial silicon germanium repeatedly and alternately in each of the two recesses by an epitaxial growth process, and the two superlattices serve as source/drain regions of the transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 depict a fabricating method of a transistor with strained superlattices as source/drain regions according to a preferred embodiment of the present invention, wherein:

FIG. 1 depicts a substrate with a gate structure thereon;
FIG. 2 depicts a stage following FIG. 1;
FIG. 3 depicts a stage following FIG. 2;
and
FIG. 4 depicts a stage following FIG. 3.

DETAILED DESCRIPTION

FIG. 1 to FIG. 4 depict a fabricating method of a transistor with strained superlattices as source/drain regions according to a preferred embodiment of the present invention.

Figure 1:
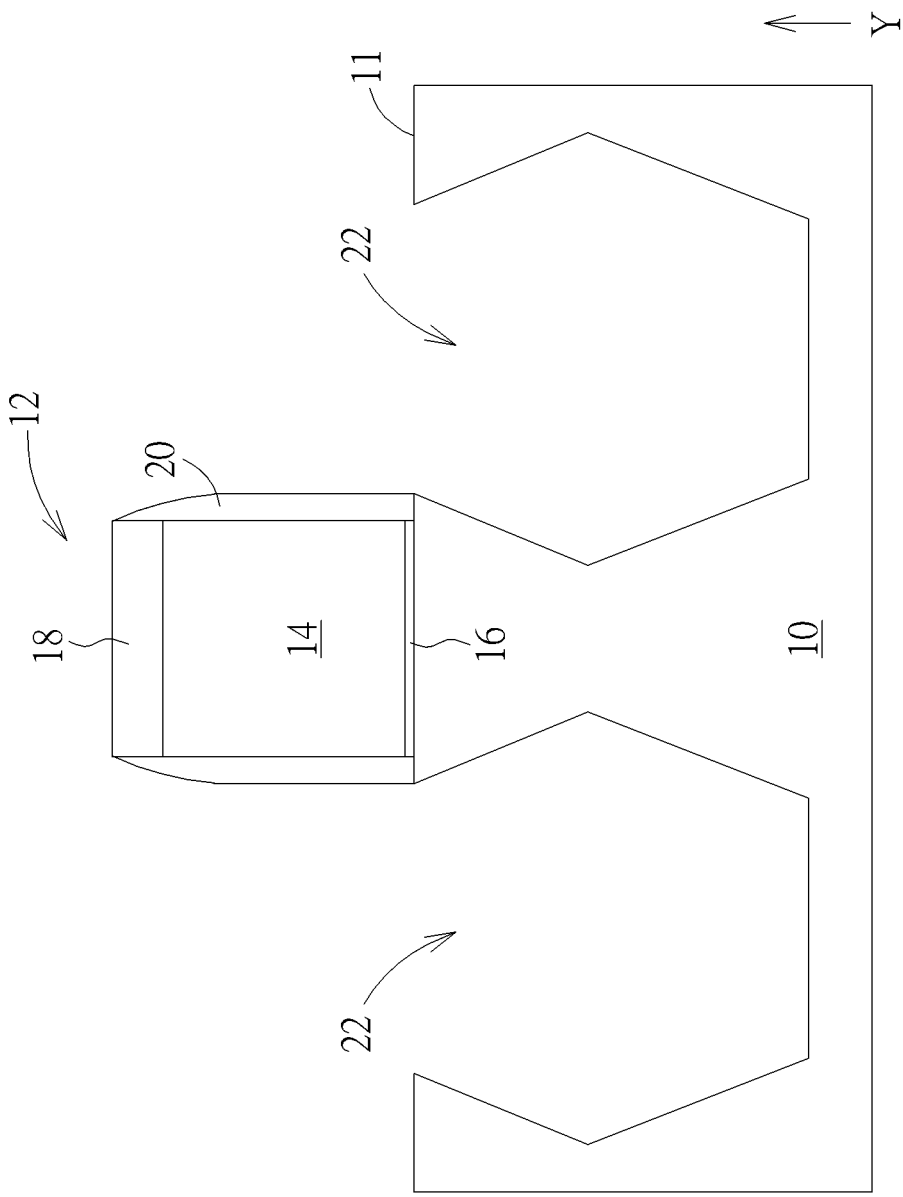

As shown in FIG. 1, a substrate 10 is provided. The substrate 10 may be a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. A gate structure 12 is disposed on the substrate 10. The gate structure 12 includes a gate electrode 14, a gate dielectric layer 16, a cap layer 18 and a spacer 20. The gate dielectric layer 16 is disposed between the substrate 10 and the gate electrode 14. The cap layer 18 covers the gate electrode 14. The spacer 20 is disposed at two sides of the gate electrode 14, the gate dielectric layer 16 and the cap layer 18. The gate electrode 14 may be metal or polysilicon. The gate dielectric layer 16 may be silicon oxide or other insulating materials. The cap layer 18 may be silicon nitride.

Next, two recesses 22 are respectively formed in the substrate 10 at two sides of the gate structure 12 by an etching process and using the gate structure 12 as a mask. The etching process includes a dry etching followed by a wet etching. Each of the recesses 22 is in a shape of hexagon. Furthermore, a vertical direction Y is perpendicular to a top surface 11 of the substrate 10.

Figure 2:
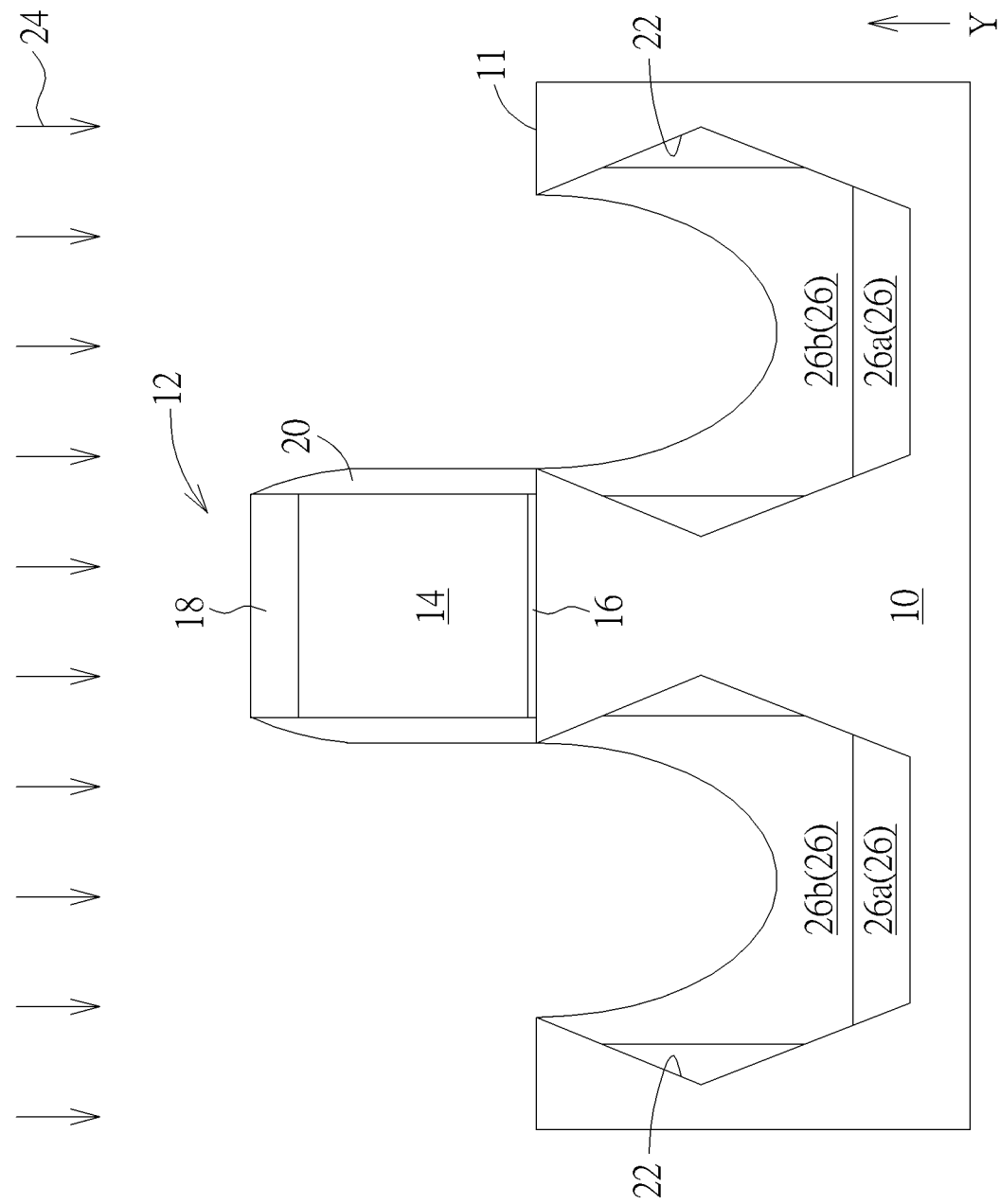

As shown in FIG. 2, an epitaxial growth process 24 is performed to form a barrier 26 on the sidewall and the bottom of each of the recesses 22. The barrier 26 is preferably epitaxial silicon germanium. Moreover, the barrier 26 may be a multilayer structure. For example, the barrier 26 can include barrier 26a and barrier 26b. The germanium concentration of the multilayer structure varies. The germanium concentration advantageously increases in a direction toward the center of each of the recesses 22. That is, the germanium concentration of the barrier 26b is larger than the germanium concentration of the barrier 26a.

Figure 3:
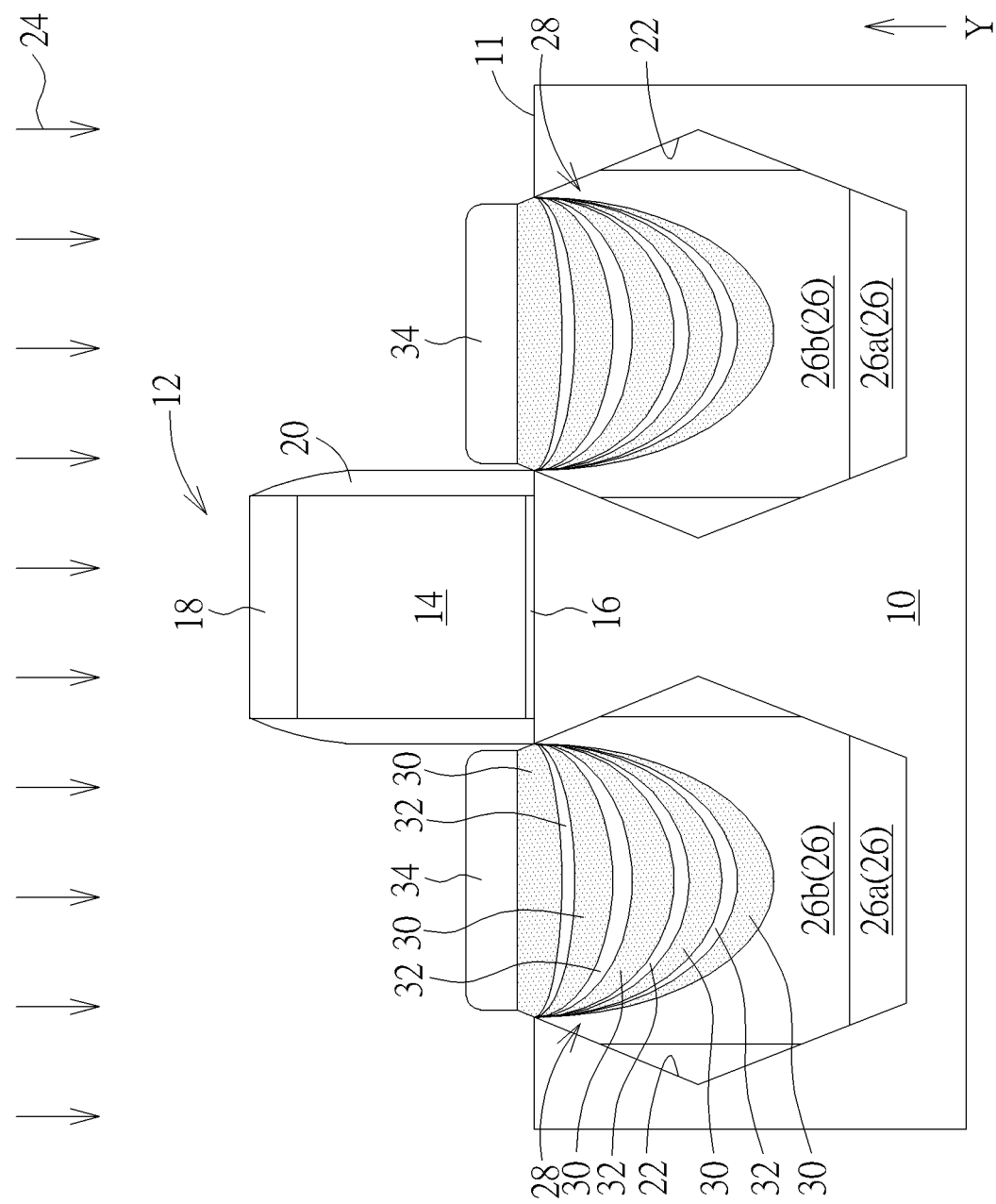

As shown in FIG. 3, the epitaxial growth process 24 is continued to form two superlattices 28 respectively in the two recesses 22. The steps of forming the superlattices 28 include forming an epitaxial silicon 32 and an epitaxial silicon germanium 30 repeatedly and alternately. Each of the superlattices 28 includes at least two layers of the epitaxial silicon germanium 30 and one layer of the epitaxial silicon 32, and the epitaxial silicon 32 is disposed between the two layers of the epitaxial silicon germanium 30. But the numbers of the epitaxial silicon germanium 30 and the epitaxial silicon 32 can be altered based on different requirements. Moreover, a thickness of the epitaxial silicon 32 is smaller than a thickness of the epitaxial silicon germanium 30. According to a preferred embodiment of the present invention, a ratio of a thickness of the epitaxial silicon 32 to a thickness of the epitaxial silicon germanium 30 is 1:1.5. For example, the thickness of the epitaxial silicon 32 is 10 to 15 angstroms. The thickness of the epitaxial silicon germanium 30 is 10 to 20 angstroms. It is noteworthy that a germanium concentration of the epitaxial silicon germanium 30 in each of the two superlattices 28 is greater than 50 at %. According to a preferred embodiment of the present invention, the germanium concentration is between 50 at % to 99 at %. That is, the germanium concentration in the epitaxial silicon germanium 30 of the superlattices 28 has a higher germanium concentration than general silicon germanium. Moreover, the germanium concentration in each epitaxial silicon germanium 30 can be the same as or different from each other. According to a preferred embodiment of the present invention, the germanium concentration in each epitaxial silicon germanium 30 is the same. According to another preferred embodiment of the present invention, the germanium concentration in each epitaxial silicon germanium 30 increases in a direction toward the top surface 11 of the substrate 10.

Furthermore, the germanium concentration in the barrier 26 is lower than the germanium concentration in each of the superlattices 28. During the formation of the barrier 26 and the superlattices 28, silane ($SiH_4$) and germane ($GeH_4$) may serve as precursors. During the formation of the barrier 26 and superlattices 28, the flow rates of the silane and the germane vary. For example, germane in a low flow rate and silane are used to form the barrier 26. Later, the flow rate of germane is increased to form the epitaxial silicon germanium 30. Then, the flow rate of germane is turned off to form the epitaxial silicon 32. Subsequently, the flow rate of germane is turned on again to form another epitaxial silicon germanium 30.

Figure 4:
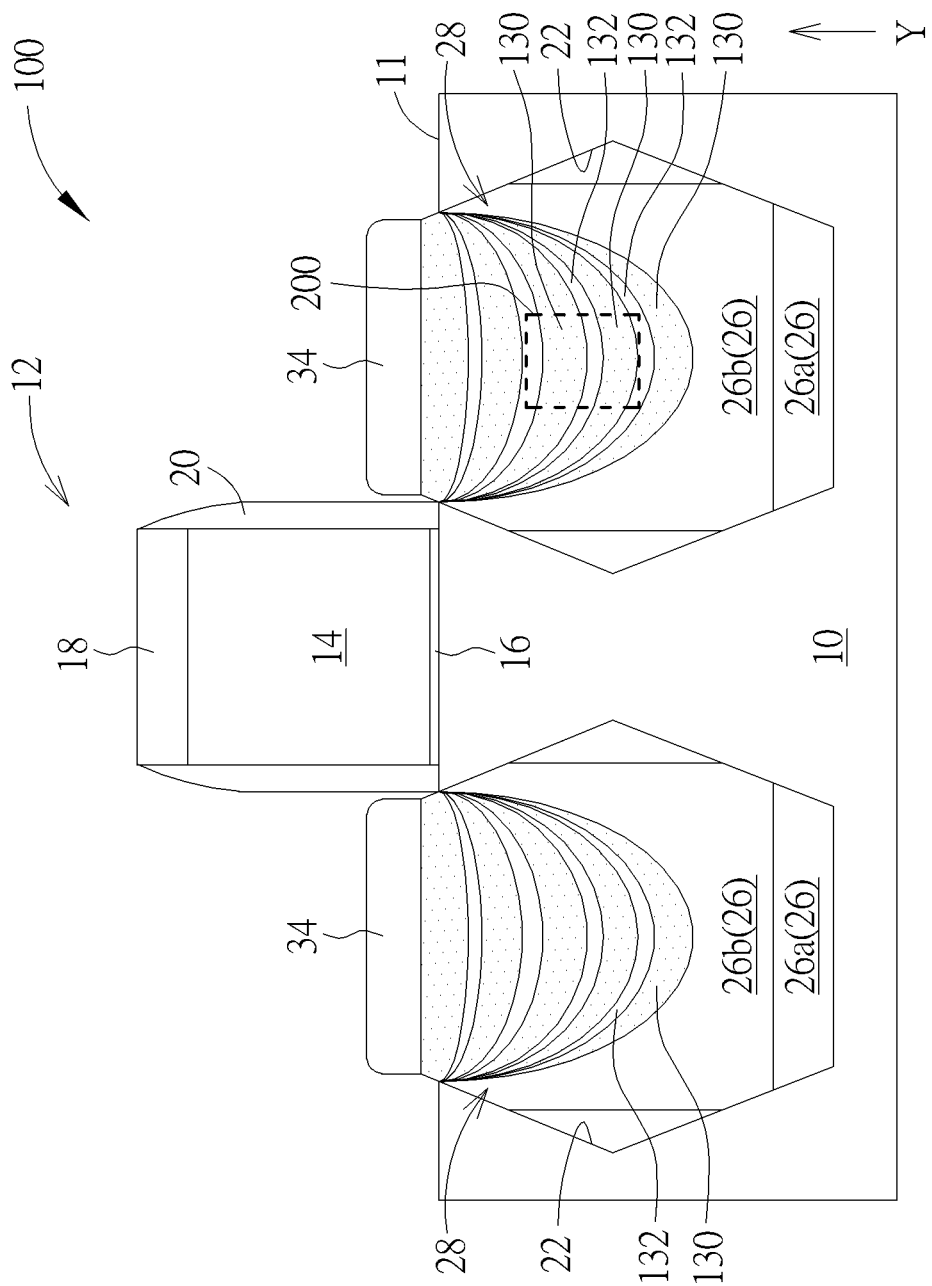

After the superlattices 28 are completed, a cap layer 34 can be formed. The cap layer 34 may be epitaxial silicon. Later, P-type dopants such as boron can be implanted into the superlattices 28 optionally. Next, a thermal process is applied to the superlattices 28 to drive in the P-type dopants or to fix the damage formed during the implantation of dopants. As shown in FIG. 4, after the thermal process, the germanium in the epitaxial silicon germanium 30 diffuses into the epitaxial silicon 32 below or on the epitaxial silicon germanium 30. Therefore, the germanium concentration in the epitaxial silicon germanium 30 decreases. Now, the epitaxial silicon 32 becomes a first epitaxial silicon germanium 132. The epitaxial silicon germanium 30 becomes a second epitaxial silicon germanium 130 because the germanium concentration is lowered. At this point, the transistor 100 of the present invention is completed. The superlattices 28 at two sides of the gate electrode 12 serve as source/drain regions of the transistor 100. The superlattices 28 having tensile stress create compressive stress in the channel of the transistor 100.

Figure 5:
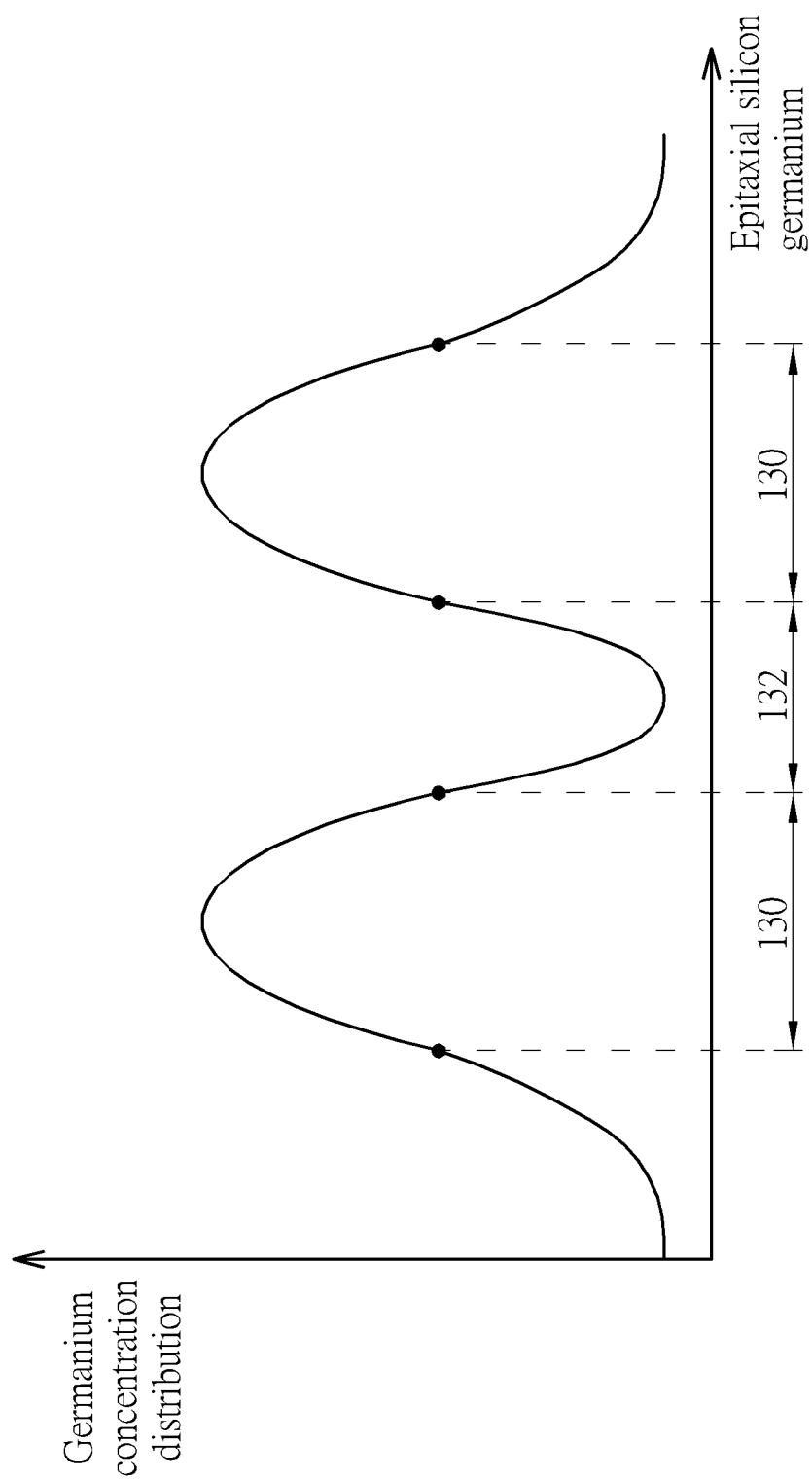
FIG. 5 depicts a distribution of a germanium concentration in a superlattice.

FIG. 5 depicts a distribution of a germanium concentration in a superlattice. Please refer to FIG. 4 and FIG. 5. The vertical coordinate in FIG. 5 shows the distribution of the germanium concentration, and the lateral coordinate shows numerous epitaxial silicon germaniums arranged in a direction toward the top surface 11 of the substrate 10 along the vertical direction Y. In FIG. 4, a frame 200 marks two layers of the second epitaxial silicon germanium 130 and one layer of the first epitaxial silicon germanium 132. In FIG. 5, the distribution of the germanium concentration of the two layers of the second epitaxial silicon germanium 130 and the one layer of the first epitaxial silicon germanium 132 in the frame 200 are shown as an example.

As shown in FIG. 5, the superlattices 28 are formed by a first epitaxial silicon germanium 132 and a second epitaxial silicon germanium 130 repeatedly alternately stacked. The germanium concentration in the superlattice 28 changes along with the positions of the first epitaxial silicon germanium 132 and the second epitaxial silicon germanium 130. In detail, the distribution of the germanium concentration creates a Gaussian distribution along the vertical direction Y. In addition, according to a preferred embodiment of the present invention, the germanium concentration at the middle of the second epitaxial silicon germanium 130 is the highest. The germanium concentration gradually decreases in a direction toward the first epitaxial silicon germanium 132. The germanium concentration at the middle of the first epitaxial silicon germanium 132 is the lowest.

As shown in FIG. 4, a transistor 100 with strained superlattices as source/drain regions includes a substrate 10. A gate structure 12 is disposed on the substrate 10, and two superlattices 28 are respectively disposed at two sides of the gate structure 12 and embedded in the substrate 10. The superlattices 28 are strained. Each of the superlattices 28 is formed by a repeated alternating stacked structure including a first epitaxial silicon germanium 132 and a second epitaxial silicon germanium 130. Moreover, the superlattices 28 serve as source/drain regions of the transistor 100 and the superlattices 28 contain tensile stress.

According to a preferred embodiment of the present invention, the superlattices 28 include boron dopants doped therein. A thickness of the first epitaxial silicon germanium 132 is smaller than a thickness of the second epitaxial silicon germanium 130. In detail, a ratio of the thickness of the first epitaxial silicon germanium 132 to the thickness of the second epitaxial silicon germanium 130 is 1:1.5. Each of the superlattices 28 at least includes two layers of the second epitaxial silicon germanium 130 and one layer of the first epitaxial silicon germanium 132, and the first epitaxial silicon germanium 132 is disposed between the two layers of the second epitaxial silicon germanium 130. The numbers of the first epitaxial silicon germanium 132 and the second epitaxial silicon germanium 130 can be altered based on different requirements. As shown in FIG. 5, the distribution of the germanium concentration in the superlattices 28 creates a Gaussian distribution along the vertical direction Y.

The conventional transistor utilizes bulk epitaxial silicon germaniums to serve as source/drain regions. However, when the germanium concentration of the bulk epitaxial silicon germanium is higher than 40 at %, and the thickness of the bulk epitaxial silicon germanium is large, the mismatch happens between the silicon atom and the germanium atom. The mismatch leads to a relaxed bulk epitaxial silicon germanium. When the germanium concentration of the bulk epitaxial silicon germanium is lower than 40 at %, the bulk epitaxial silicon germanium can't offer enough stress to the channel region. The present invention replaces the bulk epitaxial silicon germanium by the superlattice including the epitaxial silicon 32 and the epitaxial silicon germanium 30. Because the epitaxial silicon germanium 30 is thinner, the possibility of the mismatch is lowered and the germanium concentration can be increased to become higher than 50 at %. In the end, the stress in the superlattice 28 is larger than the stress in the bulk epitaxial silicon germanium.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor with strained superlattices as source/drain regions, comprising:
   a substrate;
   a gate structure disposed on the substrate;
   two superlattices respectively disposed at two sides of the gate structure and embedded in the substrate, wherein the two superlattices are strained, each of the two superlattices is formed by a repeated alternating stacked structure including a first epitaxial silicon germanium and a second epitaxial silicon germanium, and the two superlattices serve as source/drain regions of the transistor; and
   a vertical direction perpendicular to a top surface of the substrate, wherein a germanium concentration in each of the two superlattices creates a Gaussian distribution along the vertical direction.

2. The transistor with strained superlattices as source/drain regions of claim 1, further comprising boron dopants doped in the two superlattices.

3. The transistor with strained superlattices as source/drain regions of claim 1, wherein a thickness of the first epitaxial silicon germanium is smaller than a thickness of the second epitaxial silicon germanium.

4. The transistor with strained superlattices as source/drain regions of claim 1, wherein a ratio of a thickness of the first epitaxial silicon germanium to a thickness of the second epitaxial silicon germanium is 1:1.5.

5. The transistor with strained superlattices as source/drain regions of claim 1, wherein a germanium concentration of the second epitaxial silicon germanium in each of the two superlattices is greater than 50 at %.

6. The transistor with strained superlattices as source/drain regions of claim 1, wherein both of the two superlattices contains tensile stress.

7. The transistor with strained superlattices as source/drain regions of claim 1, wherein each of the two superlattices comprises two layers of the second epitaxial silicon germanium and one layer of the first epitaxial silicon germanium, and the first epitaxial silicon germanium is disposed between the two layers of the second epitaxial silicon germanium.

8. A fabricating method of a transistor with strained superlattices as source/drain regions, comprising:
   providing a substrate, wherein a gate structure is disposed on the substrate;
   forming two recesses in the substrate at two sides of the gate structure; and
   forming two superlattices respectively in each of the two recesses and respectively at two side of the gate structure and embedded in the substrate, wherein the two superlattices are strained, each of the two superlattices is formed by a repeated alternating stacked structure including a first epitaxial silicon germanium and a second epitaxial silicon germanium, and the steps of forming the two superlattices comprises:
      forming an epitaxial silicon and an epitaxial silicon germanium repeatedly and alternately in each of the two recesses by an epitaxial growth process; and
      performing a thermal process to diffuse germanium from the epitaxial silicon germanium into the epitaxial silicon so as to turn the epitaxial silicon into the first epitaxial silicon germanium and the epitaxial silicon germanium into the second epitaxial silicon germanium, wherein the two superlattices serve as source/drain regions of the transistor, a vertical direction is perpendicular to a top surface of the substrate, and a germanium concentration in each of the two superlattices creates a Gaussian distribution along the vertical direction.

9. The fabricating method of a transistor with strained superlattices as source/drain regions of claim 8, further comprising doping boron dopants into the two superlattices.

10. The fabricating method of a transistor with strained superlattices as source/drain regions of claim 8, wherein the two superlattices contain tensile stress.

11. The fabricating method of a transistor with strained superlattices as source/drain regions of claim 8, wherein a thickness of the epitaxial silicon is smaller than a thickness of the epitaxial silicon germanium.

12. The fabricating method of a transistor with strained superlattices as source/drain regions of claim 8, wherein a germanium concentration of the epitaxial silicon germanium in each of the two superlattices is greater than 50 at %.

13. The fabricating method of a transistor with strained superlattices as source/drain regions of claim 8, wherein each of the two superlattices comprises two layers of the epitaxial silicon germanium and one layer of the epitaxial silicon, and the epitaxial silicon is disposed between the two layers of the epitaxial silicon germanium.

\* \* \* \* \*